(12) United States Patent
Kao (10) Patent No.: US 7,535,063 B2
(45) Date of Patent: May 19, 2009

(54) ESD PROTECTION DEVICE STRUCTURE

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 109 days.

(21) Appl. No.: 11/160,518

(22) Filed: Jun. 28, 2005

(65) Prior Publication Data

US 2006/0289936 A1 Dec. 28, 2006

(51) Int. Cl.
*H01L 29/94* (2006.01)

(52) U.S. Cl. .................................................. 257/365

(58) Field of Classification Search ......... 257/335–365, 257/E29.345, 29.001
See application file for complete search history.

(56) References Cited

U.S. PATENT DOCUMENTS

| 6,373,109 B1 | 4/2002 | Ahn |
| 6,465,768 B1 * | 10/2002 | Ker et al. ................. 250/214.1 |
| 6,690,067 B2 * | 2/2004 | Ker et al. ..................... 257/355 |
| 6,833,568 B2 * | 12/2004 | Duvvury et al. ............. 257/173 |
| 7,071,528 B2 * | 7/2006 | Ker et al. ..................... 257/492 |
| 2003/0197246 A1 * | 10/2003 | Ker et al. ..................... 257/565 |
| 2006/0065933 A1 * | 3/2006 | Chu et al. .................... 257/355 |
| 2006/0091465 A1 * | 5/2006 | Chen .......................... 257/360 |

* cited by examiner

*Primary Examiner*—Nathan W Ha
(74) *Attorney, Agent, or Firm*—Winston Hsu (57) ABSTRACT

An electrostatic discharge (ESD) protective device structure. The ESD protection device includes: at least a first conductive type metal-oxide semiconductor (MOS), in which the drain and source of the first conductive type MOS are electrically connected to a first power terminal and a second power terminal separately; at least a second conductive type diffusion region; and at least a dummy gate disposed between the first conductive type MOS and the second conductive type diffusion region, wherein the gate length of the dummy gate is less than the gate length of the first conductive type MOS gate, such that the junction between the second conductive type diffusion region and the drain of the first conductive type MOS have a low breakdown voltage.

9 Claims, 7 Drawing Sheets

Fig. 7

ESD PROTECTION DEVICE STRUCTURE

BACKGROUND OF THE INVENTION

1. Field of the Invention

The invention relates to an electrostatic discharge (ESD) protection device.

2. Description of the Prior Art

With the continued miniaturization of integrated circuit (IC) devices, the current trend in the sub-quarter-micron complementary metal-oxide semiconductor (CMOS) industry is to produce integrated circuits having shallower junction depths, thinner gate oxides, lightly-doped drain (LDD) structures, shallow trench isolation (STI) structures, and self-aligned silicide (salicide) processes. Nevertheless, all of these processes cause the related CMOS IC products to become more susceptible to electrostatic discharge (ESD) damage. Therefore, ESD protection circuits are built onto the chip to protect the devices and circuits of the IC against ESD damage. It is generally desired that the ESD robustness for commercial IC products be higher than 2 kV in human-body-model (HBM) ESD stress, and in order to sustain ESD overstress, devices with large dimensions need to be designed into the on-chip ESD protection circuit, and require a large total layout area on the silicon substrate.

Typically, the NMOS of an I/O ESD protection circuit has a total channel width of greater than 300 μm. With such large device dimensions, the NMOS is often realized with multiple fingers in the layout. However, under ESD stress, the multiple fingers of ESD protection NMOS do not uniformly turn on to bypass the ESD current. Only a portion of the fingers of the NMOS may be turned on, and consequently lead to damage from the ESD pulse. In this case, although the ESD protection NMOS has a very large device dimension, the ESD protection level is low.

In order to improve the turn-on uniformity among the multiple fingers, a gate-driven design has been commonly used to increase the protection level of the ESD protection device within large scale NMOS devices. However, it has been found that the ESD protection level of the gate-driven NMOS decreases dramatically when the gate voltage is somewhat increased. As it turns out, the gate-driven design pulls ESD current flowing through the channel surface of the NMOS. The NMOS is thus more easily burnt-out by the ESD energy.

Figure 1:
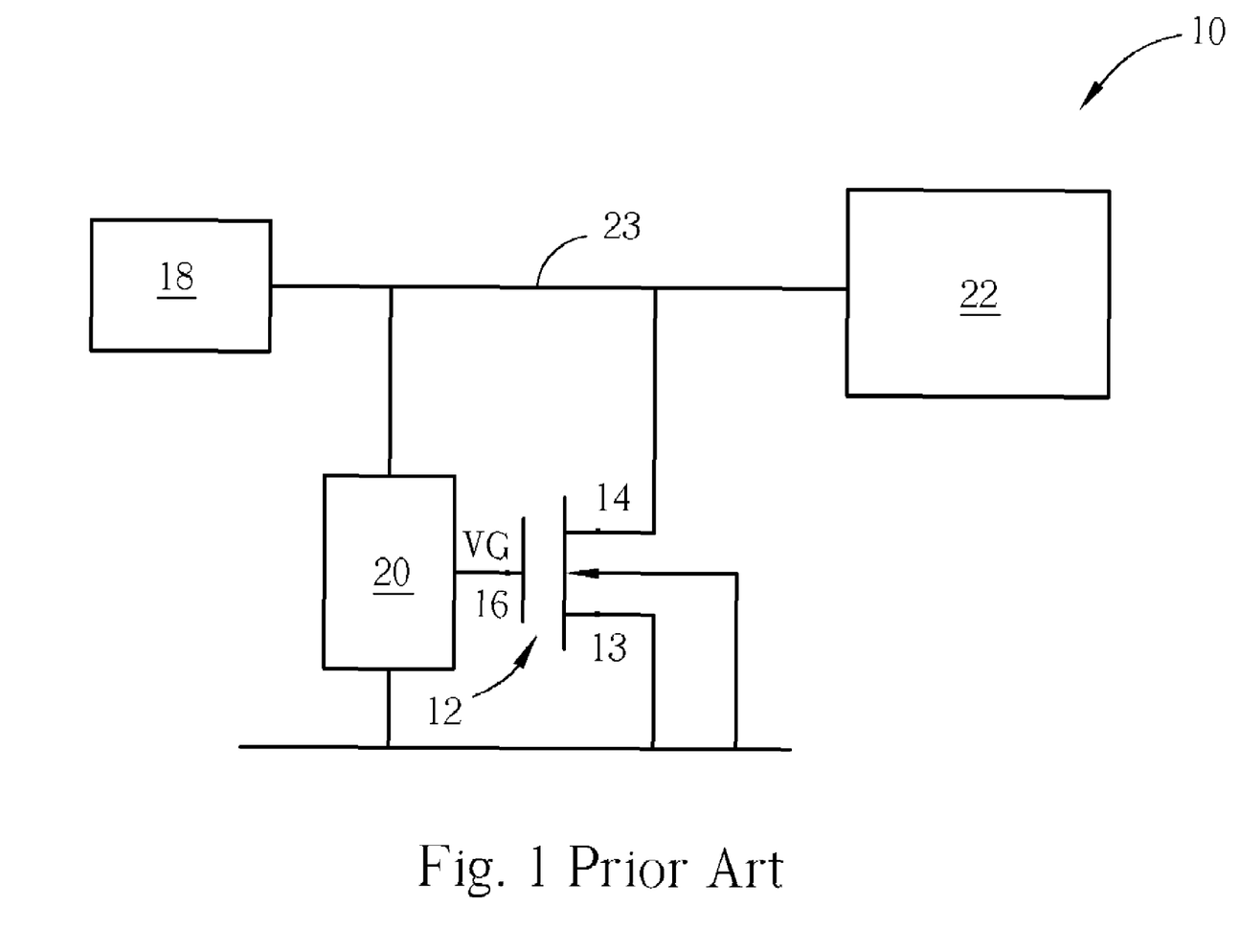
FIG. 1 is a schematic circuit diagram of a conventional ESD protection design by utilizing a gate-driven technique.

Please refer to FIG. 1. FIG. 1 is a schematic circuit diagram of a conventional ESD protection design by utilizing a gate-driven technique. Since all ESD protection designs using the gate-driven technique have the same basic idea, they may be generally illustrated as disclosed in FIG. 1. As shown in FIG. 1, the ESD protection circuit design 10 includes an ESD protection NMOS 12. The NMOS 12 includes a source 13, a drain 14 and a gate 16. The drain 14 of the NMOS 12 is electrically connected to a pad 18 and the gate 16 is biased by a gate-biasing circuit 20. The gate-biasing circuit 20 is typically designed with a coupled capacitor (not shown) electrically connected from the pad 18 to the gate and a resistor (not shown) electrically connected from the gate 16 to a $V_{SS}$ power terminal. Additionally, an internal circuit 22 is electrically connected to the pad 18 through a conductor 23.

When a positive ESD voltage zaps the pad 18, a sharp-rising ESD voltage pulse is coupled to the gate 16 of the ESD protection NMOS 12. The ESD protection NMOS 12 is thus turned on to discharge the ESD current from the pad 18 to the $V_{SS}$ power terminal. This is the so-called gate-coupled design or gate-driven design. The gate bias improves the turn-on uniformity of the multiple fingers of the ESD protection NMOS, but an excessive gate bias also causes the ESD current to flow through the inversion layer of the surface channel of the ESD protection NMOS 12, which can burn out the channel of the NMOS 12.

Figure 2:
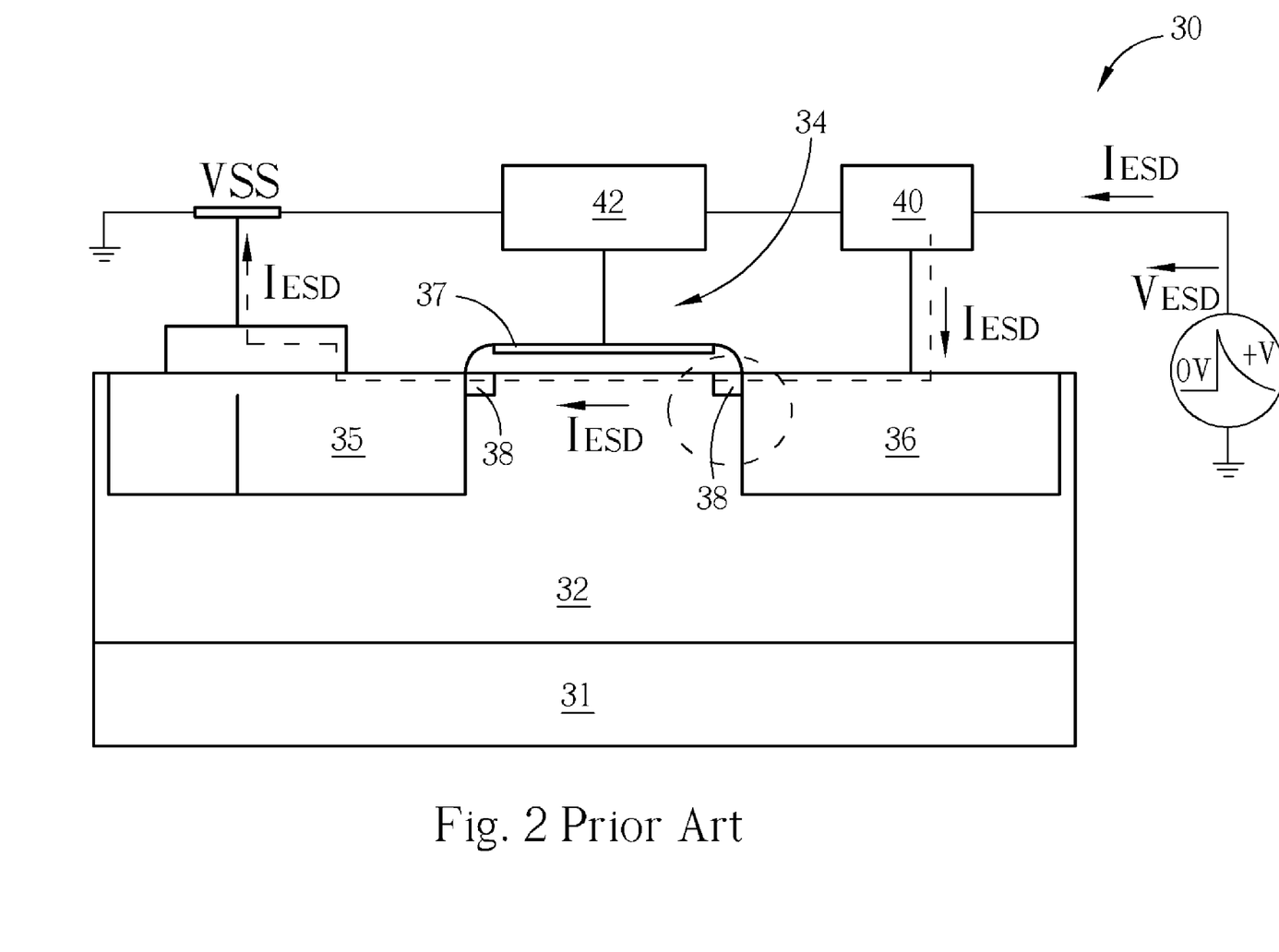
FIG. 2 is a schematic diagram of an ESD current path flowing through a gate-driven NMOS device.

Please refer to FIG. 2. FIG. 2 is a schematic diagram of an ESD current path flowing through a gate-driven NMOS device. As shown in FIG. 2, an ESD protection NMOS device 30 includes a P substrate 31, a P-well 32 in the P substrate 31, and an NMOS transistor 34 in the P-well 32. The NMOS transistor 34 includes a source 35, a drain 36 and a doped polysilicon gate 37, and two lightly doped drains (LDD) 38 adjacent to the source 35 and drain 36 respectively. The source 35 region is electrically connected to a $V_{SS}$ power terminal, the drain 36 region is electrically connected to a pad 40, and the gate 37 region is electrically connected to a gate-biasing circuit 42. In FIG. 2, ESD damage is often located at the surface channel close to the LDD 38 edge of the drain 36.

The gate-biasing circuit 42 generates a high voltage ($V_G$) to bias the gate 37 of the NMOS transistor 34 during positive ESD zapping events. The generated $V_G$ gate voltage turns on the surface channel of the NMOS. Unfortunately, the surface channel of the NMOS 34 having a structure with a much shallower junction depth and smaller volume is more susceptible to ESD damage. As a result, the overheating caused by the damage may also damage the NMOS 34 itself. The ESD damage is often located at the surface channel close to the LDD 38 corner of the drain 36. In general, a large ESD current (typically 1.33 Amp, for a 2 kV HMB ESD event) flowing through the very shallow surface channel of the NMOS transistor 34 often burns out the NMOS transistor 34 even if the NMOS 34 has large device dimensions.

Figure 3:
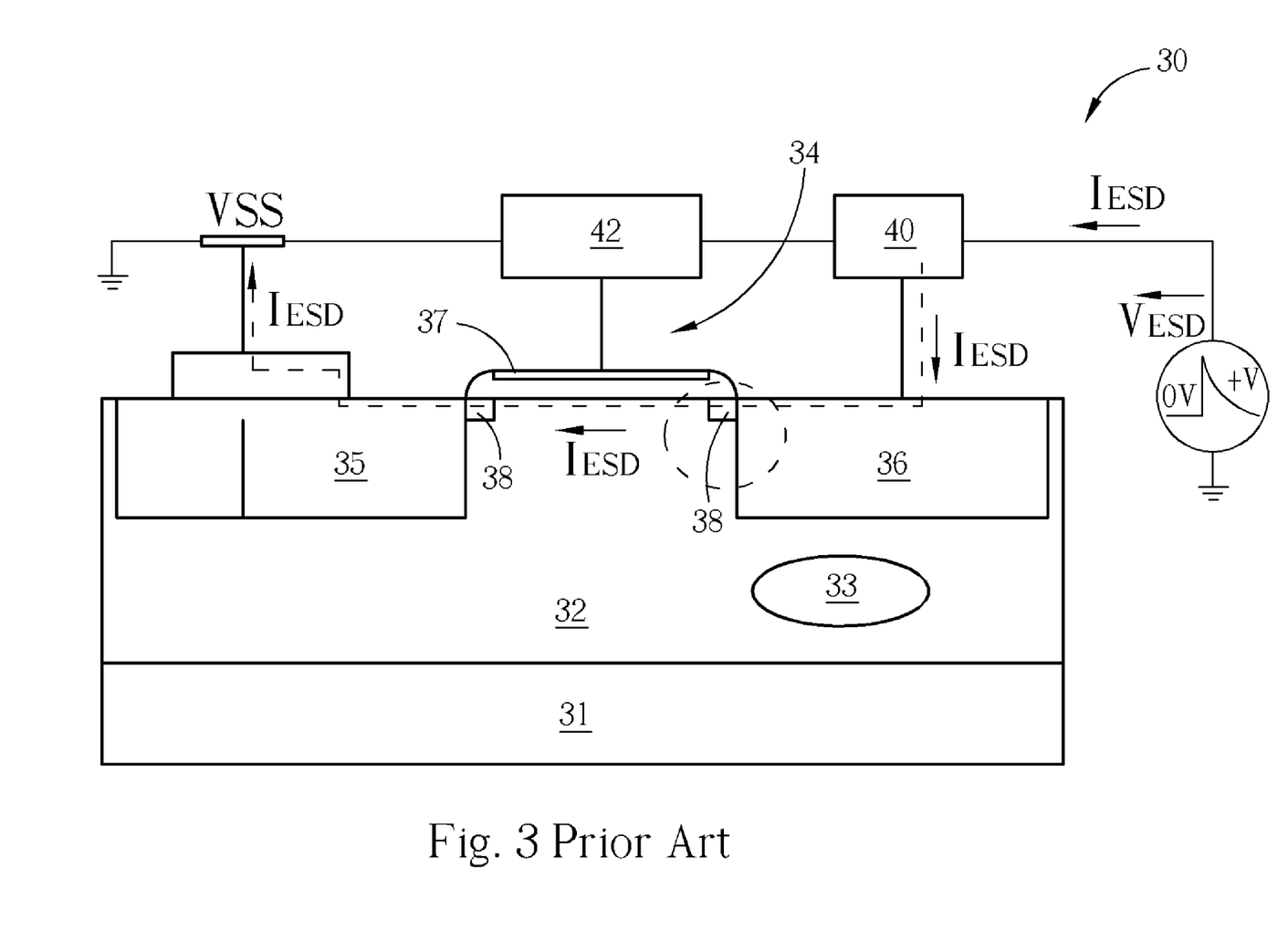
FIG. 3 is a perspective diagram showing the means of forming a diffusion region below the well of a conventional ESD protection device.

Please refer to FIG. 3. FIG. 3 is a perspective diagram showing the means of forming a diffusion region below the well of a conventional ESD protection device. As shown in FIG. 3, in order to reduce the burnout of the surface channel of the NMOS 34, a P+ diffusion region 33 is often formed below the drain 36 of the conventional ESD protection device 30 to lower the breakdown voltage of the PN junction formed between the drain 36 and the P-well 32. Since the P+ diffusion region 33 is formed below the drain 36, processes including a deep well fabrication process, a salicide block (SAB) mask, and an ion implantation have to be performed or utilized to lower the breakdown voltage between junctions to improve the efficiency of the ESD protection device, and thereby increase the complexity of the fabrication processes and cause misalignment problems.

SUMMARY OF THE INVENTION

It is therefore an objective of the present invention to provide an ESD protection device for solving the above-mentioned problems.

According to the present invention, an electrostatic discharge (ESD) protection device, wherein the ESD protection device is disposed on a substrate, the ESD protection device comprises: at least a first conductive type metal-oxide semiconductor (MOS), in which the drain and source of the first conductive type MOS are electrically connected to a first power terminal and a second power terminal separately; at least a second conductive type diffusion region; and at least a dummy gate disposed between the first conductive type MOS and the second conductive type diffusion region, in which the gate length of the dummy gate is less than the gate length of the first conductive type MOS gate, such that the junction between the second conductive type diffusion region and the drain of the first conductive type MOS have a low breakdown voltage.

Additionally, the present invention discloses another electrostatic discharge (ESD) protection device, in which the ESD protection device is disposed on a substrate, and the ESD protection device further includes: at least a first conductive type metal-oxide semiconductor (MOS), in which the drain and source of the first conductive type MOS are electrically connected to a first power terminal and a second power terminal separately; at least a second conductive type diffusion region; and at least a first conductive type lightly doped drain (LDD) disposed adjacent to the first conductive type MOS and the second conductive type diffusion region, such that the junction between the second conductive type diffusion region and the drain of the first conductive type MOS have a low breakdown voltage.

In contrast to the conventional ESD protection device, the present invention discloses an ESD protection device structure by forming an N+ diffusion region and a P+ diffusion region separately on each end of the dummy gate for decreasing the breakdown voltage of the PN junction. Consequently, when the length of the dummy gate is decreased to a certain degree, the concentration of the PN junction created by the N+ diffusion region and the P+ diffusion region will be increased thereby greatly reducing the junction breakdown voltage and improving the overall efficiency of the ESD protection device.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
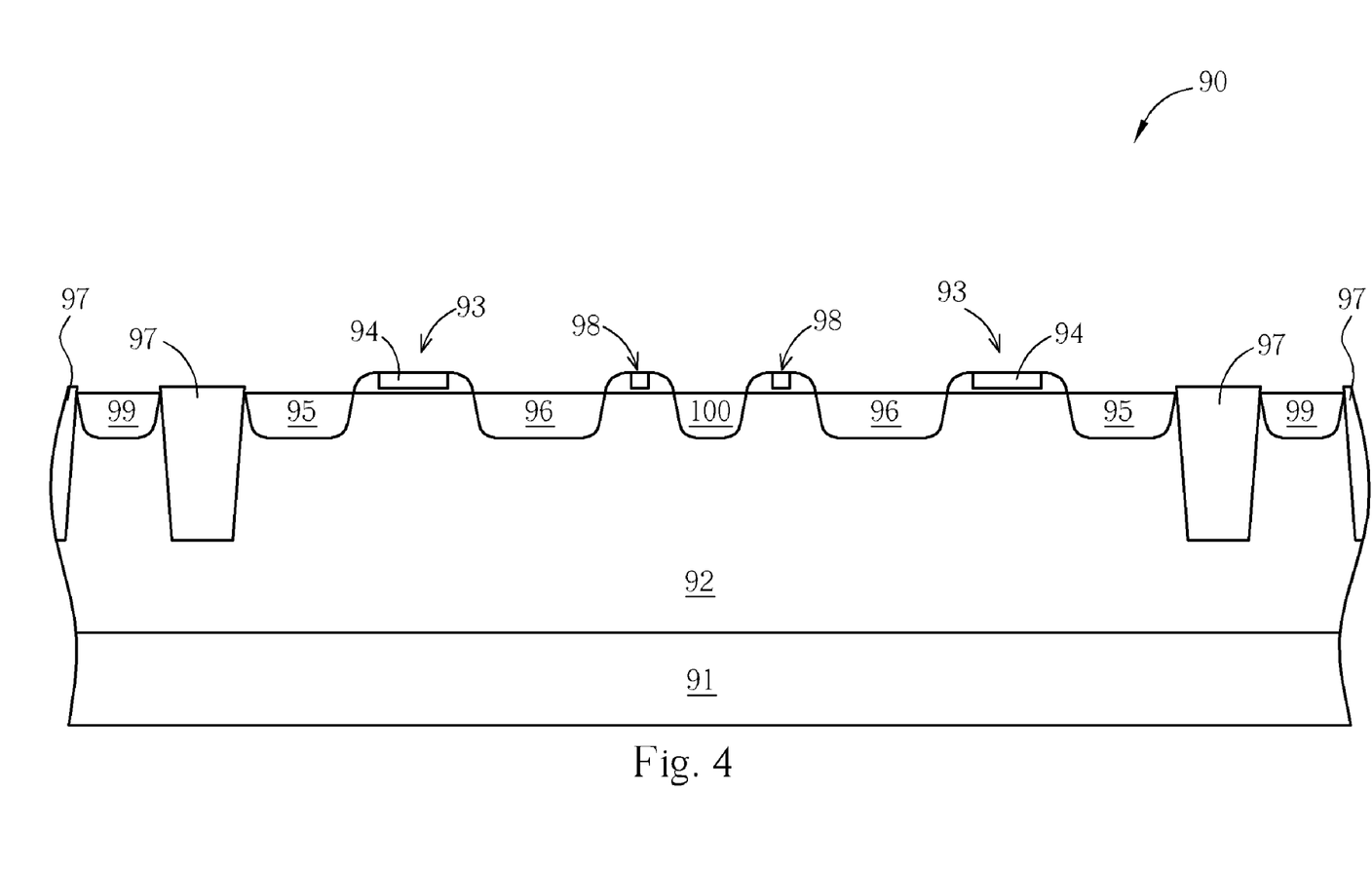
FIG. 4 is a perspective diagram showing the ESD protection device according to the first embodiment of the present invention.

Please refer to FIG. 4. FIG. 4 is a perspective diagram showing an ESD protection device 90 according to the first embodiment of the present invention. As shown in FIG. 4, the ESD protection device 90 is formed on the P-well 92 of a substrate 91, in which the ESD protection device 90 includes two NMOS devices 93, an I/O buffering pad (not shown) and a $V_{SS}$ power terminal (not shown) electrically connected to the NMOS device 93, a P+ diffusion region 100, two P+ diffusion regions 99, and two dummy gates 98 disposed between the NMOS device 93 and P+ diffusion region 100. Preferably, the substrate 91 can be a P-type substrate or an N-type substrate and each of the NMOS devices 93 also includes a drain 96 electrically connected to the I/O buffering pad, a source 95 electrically connected to the $V_{SS}$ power terminal, and a doped polysilicon gate 94. As shown in FIG. 4, the P+ diffusion region 100 is in the same side as the drain 96 with respect to the source 95, and the gate length of the dummy gates 98 is less than the gate length of the doped polysilicon gate of the NMOS device 93. Additionally, the ESD protection device 90 further includes a plurality of shallow trench isolations (STI) 97 for separating the source 95 of the NMOS device 93 from the P+ diffusion region 99, which has been serving as a pickup end of the P-type well 92.

Ideally, the present invention is able to utilize the same P-type ion implantation process and mask patterns of other PMOS devices on the substrate 91 and the dummy gates 98 to form and self align the P+ diffusion region 100 and increase the concentration of the PN junction created between the N+ diffusion region (i.e. the drain 96) and the P+ diffusion region 100, thereby decreasing the breakdown voltage of the PN junction and improving the efficiency of the ESD protection device 90. By eliminating the utilization of an extra salicide block mask and an ion implantation process for forming the P+ diffusion region 100, the present invention is able to effectively reduce the complexity and misalignment problem of the conventional ESD protection device. Moreover, the efficiency will be even greater if the length of the dummy gates 98 is further decreased.

In general, after an ESD voltage pulse is applied to the I/O buffering pad, the drain 96 of the NMOS device 93 and the P-well 92 will form a PN junction with a low breakdown voltage. Since the drain 96 and the source 95 of the NMOS device 93 and the P-well 92 form a parasitic lateral NPN bipolar junction transistor (BJT), the ESD voltage pulse will be directed from the drain 96 to the P+ diffusion region 100, from the P+ diffusion region 100 to the P-well 92 below the dummy gate 98, from the dummy gate 98 to the source 95, and will finally exit via the $V_{SS}$ power terminal.

Figure 5:
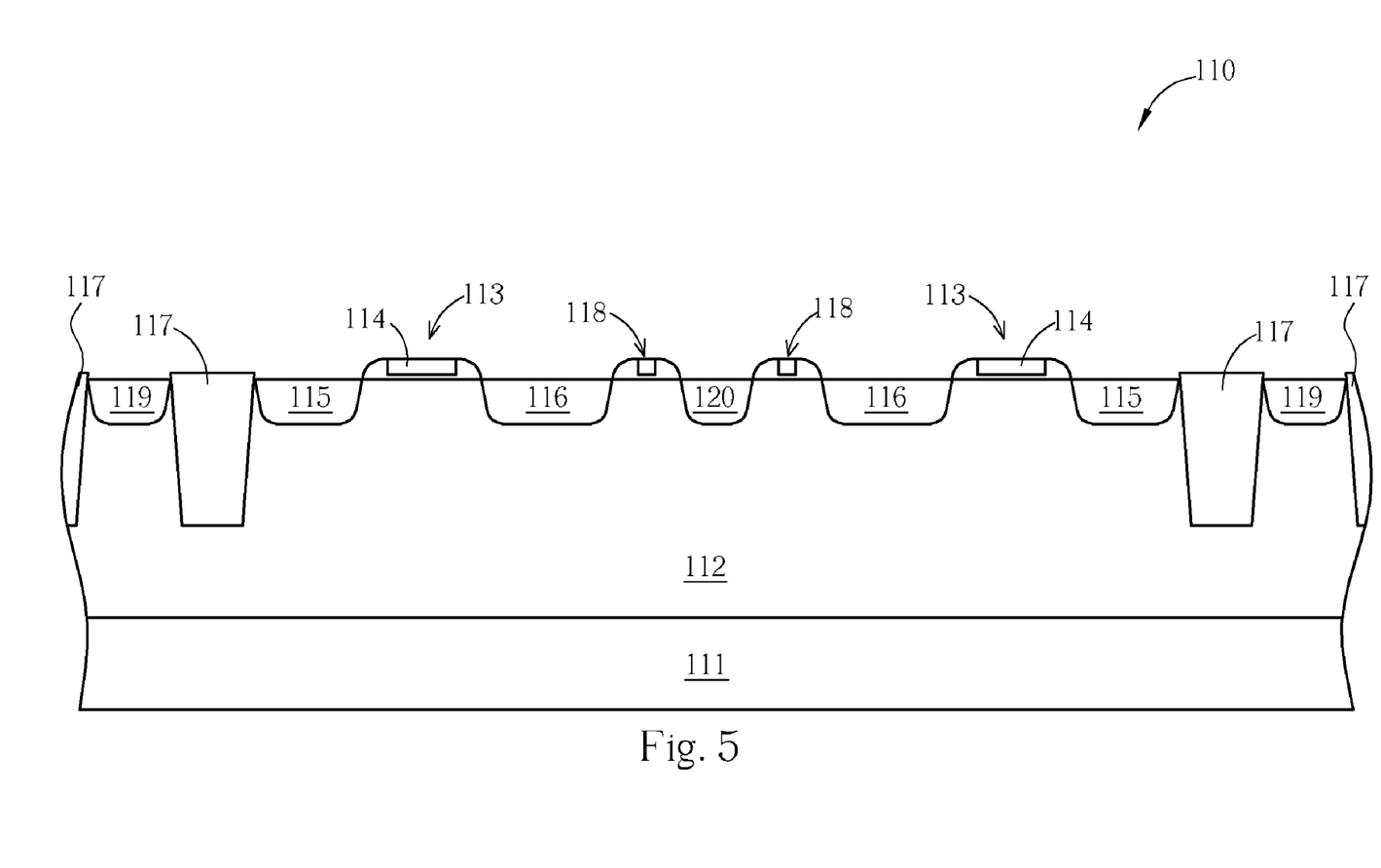
FIG. 5 is a perspective diagram showing the ESD protection device according to the second embodiment of the present invention.

Please refer to FIG. 5. FIG. 5 is a perspective diagram showing the ESD protection device 110 according to the second embodiment of the present invention. As shown in FIG. 5, an ESD protection device 110 is formed on the N-well 112 of a substrate 111, in which the ESD protecting device 110 includes two PMOS devices 113, an I/O buffering pad (not shown) and a $V_{SS}$ power terminal (not shown) electrically connected to the PMOS device 113, an N+ diffusion region 120, two N+ diffusion regions 119, and two dummy gates 118 disposed between the PMOS device 113 and N+ diffusion region 120. Preferably, the substrate 111 can be a P-type substrate or an N-type substrate and each of the PMOS devices 113 also includes a drain 116 electrically connected to the I/O buffering pad, a source 115 electrically connected to the $V_{SS}$ power terminal, and a doped polysilicon gate 114. As shown in FIG. 5, the N+ diffusion region 120 is in the same side as the drain 116 with respect to the source 115, and the gate length of the dummy gates 118 is less than the gate length of the doped polysilicon gate of the PMOS device 113. Additionally, the ESD protection device 110 further includes a plurality of shallow trench isolations (STI) 117 for separating the source 115 of the PMOS device 113 from the N+ diffusion region 119, which has been serving as a pickup end of the N-type well 112.

Similarly, after an ESD voltage pulse is applied to the I/O buffering pad, the drain 116 of the PMOS device 113 and the N-well 112 will form a PN junction with a low breakdown voltage. Since the drain 116 and the source 115 of the PMOS device 113 and the N-well 112 form a parasitic lateral PNP bipolar junction transistor (BJT), the ESD voltage pulse will be directed from the drain 116 to the P+ diffusion region 120 via the PN junction, from the P+ diffusion region 120 to the N-well 112 below the dummy gate 118, from the N-well 112 to the source 115, and will finally exit via the $V_{SS}$ power terminal.

Figure 6:
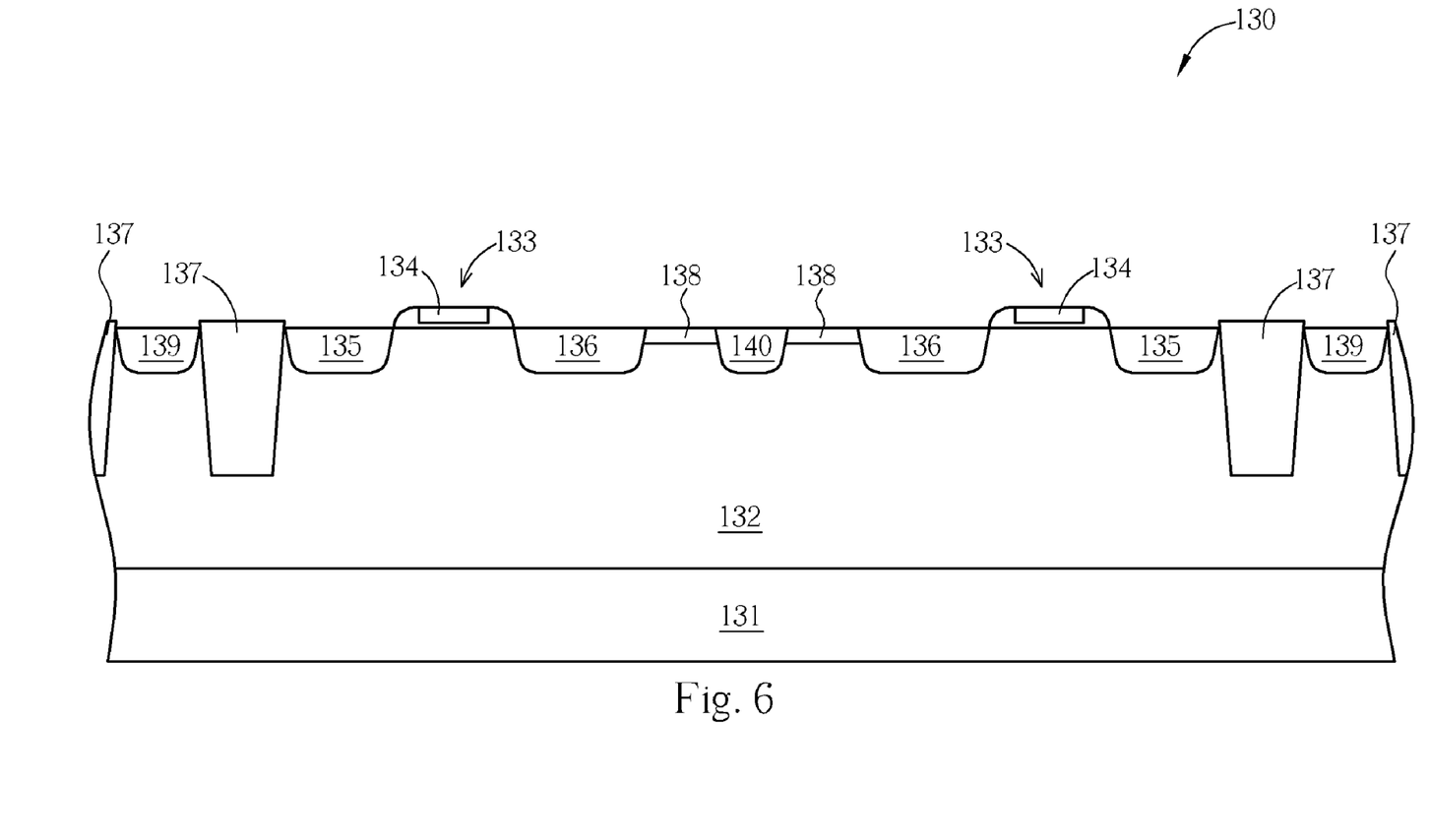
FIG. 6 is a perspective diagram showing the ESD protection device according to the third embodiment of the present invention.

Please refer to FIG. 6. FIG. 6 is a perspective diagram showing the ESD protection device 130 according to the third embodiment of the present invention. As shown in FIG. 6, an ESD protection device 130 is formed on the P-well 132 of a substrate 131, in which the ESD protection device 130 includes two NMOS devices 133, an I/O buffering pad (not shown) and a $V_{SS}$ power terminal (not shown) electrically connected to the NMOS device 133, a P+ diffusion region 140, two P+ diffusion regions 139, and two N+ lightly doped drains (NLDD) 138 disposed between the NMOS device 133 and P+ diffusion region 140. Preferably, the substrate 131 can be a P-type substrate or an N-type substrate and each of the NMOS devices 133 also includes a drain 136 electrically connected to the I/O buffering pad, a source 135 electrically connected to the $V_{SS}$ power terminal, and a doped polysilicon gate 134. Additionally, the ESD protection device 130 further includes a plurality of shallow trench isolations (STI) 137 for separating the source 135 of the NMOS device 133 from the P+ diffusion region 139.

In contrast to the previous embodiments, the two NLDDs 138 formed between the NMOS device 133 and the P+ diffusion region 140 are utilized for replacing the two dummy gates 98 and 118 from the previous embodiments, such that the distance between the P+ diffusion region 140 and the adjacent NLDDs 138 will become smaller, thereby facilitating the ESD protection device to be utilized in sub 90 nm fabrication processes. Additionally, the present embodiment is able to utilize the same P-type ion implantation process and mask patterns from other PMOS devices on the substrate 131 and the same ion implantation process and mask patterns required for the lightly doped drains of other NMOS devices on the substrate 131 to form the P+ diffusion region 140 and the two NLDDs 138 for increasing the concentration of the PN junction created between the N+ diffusion region (i.e. the drain 136) and the P+ diffusion region 140, decreasing the breakdown voltage of the PN junction, and improving the efficiency of the ESD protection device 130. By eliminating the utilization of an extra salicide block mask and an ion implantation process for forming the P+ diffusion region 140, the present embodiment is able to effectively reduce the complexity and misalignment problem of the conventional ESD protection device.

Similar to the previous embodiments, after an ESD voltage pulse is applied to the I/O buffering pad, the voltage pulse will be directed from the drain 136 to the P+ diffusion region 140 via the NLDD 138, from the P+ diffusion region 140 to the P-well 132 below the NLDD 138, from the P-well 132 to the source 135, and will finally exit via the $V_{SS}$ power terminal.

Figure 7:
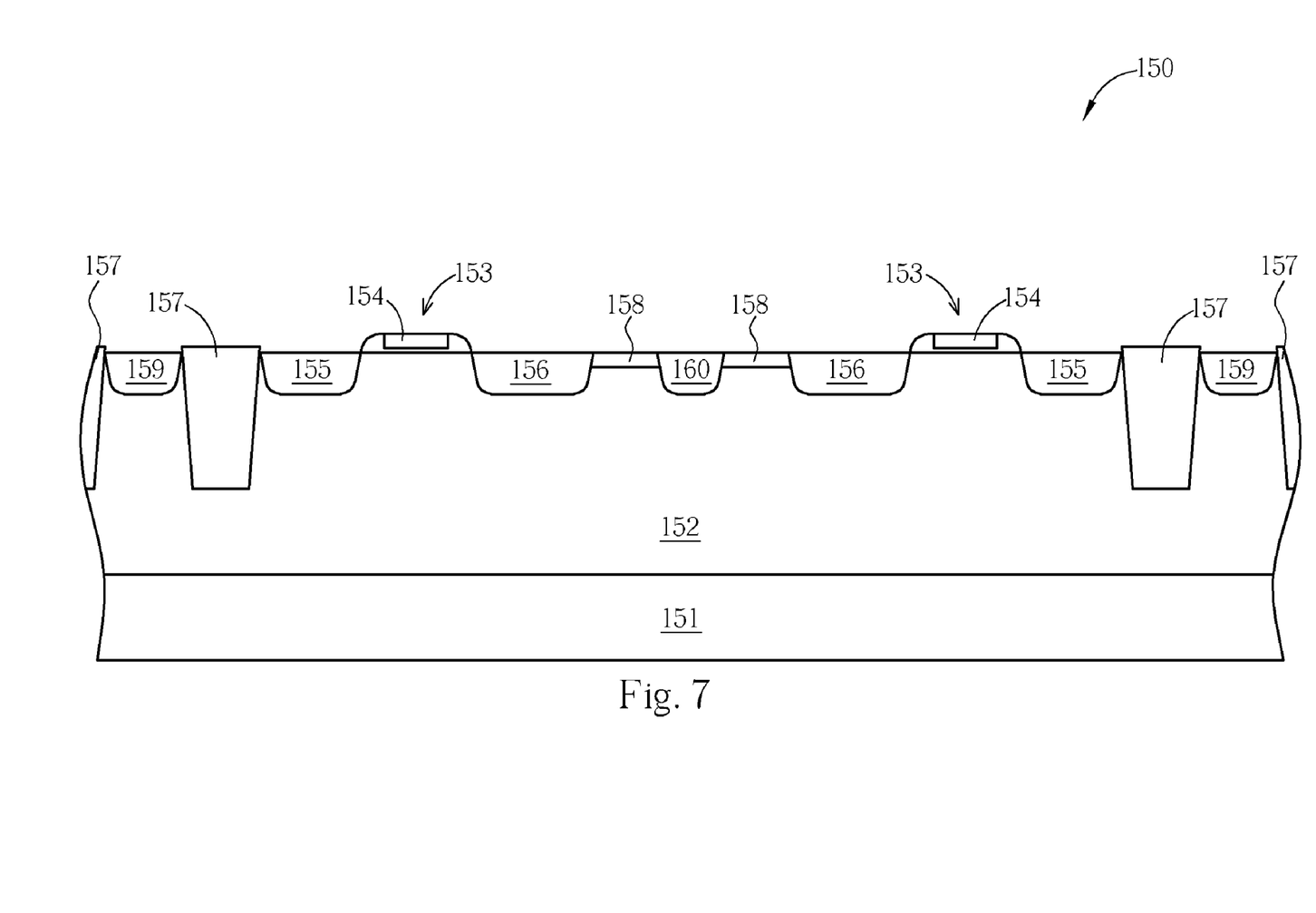
FIG. 7 is a perspective diagram showing the ESD protection device according to the fourth embodiment of the present invention.

Please refer to FIG. 7. FIG. 7 is a perspective diagram showing the ESD protection device 150 according to the fourth embodiment of the present invention. As shown in FIG. 7, an ESD protection device 150 is formed on the N-well 152 of a substrate 151, in which the ESD protecting device 150 includes two PMOS devices 153, an I/O buffering pad (not shown) and a $V_{SS}$ power terminal (not shown) electrically connected to the PMOS device 153, an N+ diffusion region 160, two N+ diffusion regions 159, and two P+ lightly doped drains (PLDD) 158 disposed between the PMOS device 153 and N+ diffusion region 160. Preferably, the substrate 151 can be a P-type substrate or an N-type substrate and each of the PMOS devices 153 also includes a drain 156 electrically connected to the I/O buffering pad, a source 155 electrically connected to the $V_{SS}$ power terminal, and a doped polysilicon gate 154. Additionally, the ESD protection device 150 further includes a plurality of shallow trench isolations (STI) 157 for separating the source 155 of the PMOS device 153 from the N+ diffusion region 159.

Similar to the third embodiment of the present invention, the two PLDDs 138 formed between the NMOS device 133 and the P+ diffusion region 140 are utilized for replacing the two dummy gates 98 and 118 from the previous embodiments. Hence after an ESD voltage pulse is applied to the I/O buffering pad, the voltage pulse will be directed from the drain 156 to the N+ diffusion region 160 via the PLDD 158, from the N+ diffusion region 160 to the N-well 152 below the PLDD 158, from the N-well 152 to the source 155, and will finally exit via the $V_{SS}$ power terminal.

In contrast to the conventional ESD protection device, the present invention discloses an ESD protection device structure by forming an N+ diffusion region and a P+ diffusion region separately on each end of the dummy gate for decreasing the breakdown voltage of the PN junction. As a result, when the length of the dummy gate is decreased to a certain degree, the concentration of the PN junction created by the N+ diffusion region and the P+ diffusion region will be increased respectively, thereby greatly reducing the junction breakdown voltage and improving the overall efficiency of the ESD protection device. For instance, the breakdown voltage of a normal PN junction usually lies around 9V and when the length of the dummy gate of the present invention decreases to approximately 0.15 µm, the junction breakdown voltage is able to be reduced to 6V. Eventually, users are able to selectively manipulate the length of the dummy gate such that the junction breakdown voltage is around 7V to control the common working voltage of the ESD protection device to be under 3.3V for achieving optimal performance and stability. Additionally, the present invention also discloses a structure of forming two N+ lightly doped drains between each NMOS and the P+ diffusion region, or alternatively, forming two P+ lightly doped drains between each PMOS and the N+ diffusion region for replacing the two dummy gates and serving as a bridge between the diffusion regions and other devices, thereby reducing the complexity of fabrication processes, decreasing the PN junction breakdown voltage, and improving the overall effectiveness of the ESD protection device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection device, wherein the ESD protection device is disposed on a substrate, the ESD protection device further comprises:
   at least a first conductive type metal-oxide semiconductor (MOS), wherein the drain and source of the first conductive type MOS are electrically connected to a first power terminal and a second power terminal separately;
   at least a second conductive type diffusion region; and
   only one first conductive type lightly doped drain (LDD) disposed between the first conductive type MOS and the second conductive type diffusion region, wherein the first conductive type lightly doped drain connects the first conductive type MOS and the second conductive type diffusion region, such that the junction between the second conductive type diffusion region and the drain of the first conductive type MOS have a low breakdown voltage.

2. The ESD protection device of claim 1, wherein the substrate further comprises a second conductive type well and the ESD protection device is disposed within the second conductive type well.

3. The ESD protection device of claim 1, wherein the drain of the first conductive type MOS, the second conductive type well, and the source of the first conductive type MOS forms a parasitic lateral bipolar junction transistor (BJT).

4. The ESD protection device of claim 1, wherein the second conductive type diffusion region is in the same side as the drain with respect to the source of the first conductive type MOS.

5. The ESD protection device of claim 1, wherein different gate length of the dummy gate of the junction formed between the second conductive type diffusion region and the drain of the first conductive type MOS comprises different breakdown voltage.

6. The ESD protection device of claim 1, wherein the first conductive type is an N-type and the second conductive type is a P-type.

7. The ESD protection device of claim 1, wherein the first conductive type is a P-type and the second conductive type is an N-type.

8. The ESD protection device of claim 1, wherein the first power terminal in an I/O buffering pad.

9. The ESD protection device of claim 1, wherein the second power terminal is a $V_{ss}$ power terminal.

* * * * *